(12) United States Patent
Sasaki et al.

(10) Patent No.: US 8,957,522 B2
(45) Date of Patent: Feb. 17, 2015

(54) SEMICONDUCTOR DEVICE AND MANUFACTURING METHOD OF SEMICONDUCTOR DEVICE

(71) Applicant: Kabushiki Kaisha Toshiba, Tokyo (JP)

(72) Inventors: Yo Sasaki, Saitama (JP); Daisuke Hiratsuka, Kanagawa (JP); Atsushi Yamamoto, Tokyo (JP); Kazuya Kodani, Kanagawa (JP); Yuuji Hisazato, Tokyo (JP); Hitoshi Matsumura, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/787,526

(22) Filed: Mar. 6, 2013

(65) Prior Publication Data
US 2014/0077377 A1 Mar. 20, 2014

(30) Foreign Application Priority Data
Sep. 19, 2012 (JP) ................................. 2012-205776

(51) Int. Cl.
H01L 23/52 (2006.01)
H01L 23/532 (2006.01)
H01L 21/768 (2006.01)
H01L 21/58 (2006.01)
H01L 23/00 (2006.01)

(52) U.S. Cl.
CPC .... *H01L 23/53238* (2013.01); *H01L 21/76841* (2013.01); *H01L 21/58* (2013.01); *H01L 24/32* (2013.01); *H01L 24/29* (2013.01); *H01L 24/83* (2013.01); *H01L 2924/01322* (2013.01)
USPC ................... 257/772; 257/751; 257/E23.023

(58) Field of Classification Search
USPC .................................. 257/772, 751, E23.023
See application file for complete search history.

(56) References Cited

U.S. PATENT DOCUMENTS

| 7,390,735 | B2 | 6/2008 | Mehrotra |
| 7,508,012 | B2 | 3/2009 | Otremba |
| 7,830,021 | B1 | 11/2010 | Wilcoxon et al. |
| 8,084,861 | B2 | 12/2011 | Otremba |
| 2002/0092895 | A1 | 7/2002 | Blackshear et al. |
| 2007/0131734 | A1* | 6/2007 | Hosseini et al. ............... 228/101 |
| 2012/0112201 | A1 | 5/2012 | Otsuka et al. |
| 2013/0001782 | A1 | 1/2013 | Otsuka et al. |
| 2013/0040437 | A1 | 2/2013 | Maeda et al. |
| 2013/0043594 | A1 | 2/2013 | Sasaki et al. |

FOREIGN PATENT DOCUMENTS

| JP | 2005-032834 A | 2/2005 |
| JP | 200532834 A | 2/2005 |

(Continued)

*Primary Examiner* — Zandra Smith
*Assistant Examiner* — Toniae Thomas
(74) *Attorney, Agent, or Firm* — Patterson & Sheridan, LLP

(57) ABSTRACT

According to one embodiment, the semiconductor device in the embodiment has an assembly substrate, a semiconductor chip, and a jointing layer. The semiconductor chip is joined to the assembly substrate via the jointing layer. An intervening diffusion barrier layer may be interposed between the chip and jointing layer. The jointing layer is an alloy layer mainly made of any metal selected from Sn, Zn and In or an alloy of Sn, Zn and In, and any metal selected from Cu, Ni, Ag, Cr, Zr, Ti and V or an alloy of any metal selected from Cu, Ni, Ag, Cr, Zr, Ti and V and any metal selected from Sn, Zn and In, where the alloy has a higher melting temperature than that of Sn, Zn and In or an alloy of Sn, Zn and/or In.

14 Claims, 12 Drawing Sheets

(56) References Cited

FOREIGN PATENT DOCUMENTS

| | | | |
|---|---|---|---|
| JP | 2007-019360 | A | 1/2007 |
| JP | 2007123566 | A | 5/2007 |
| JP | 2008238233 | A | 10/2008 |
| JP | 2009-188176 | A | 8/2009 |
| JP | 2010-040651 | A | 2/2010 |
| JP | 2010036199 | A | 2/2010 |

\* cited by examiner

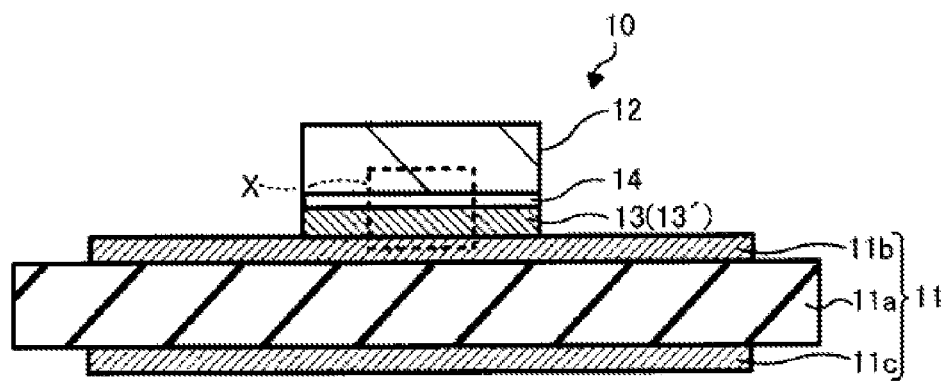
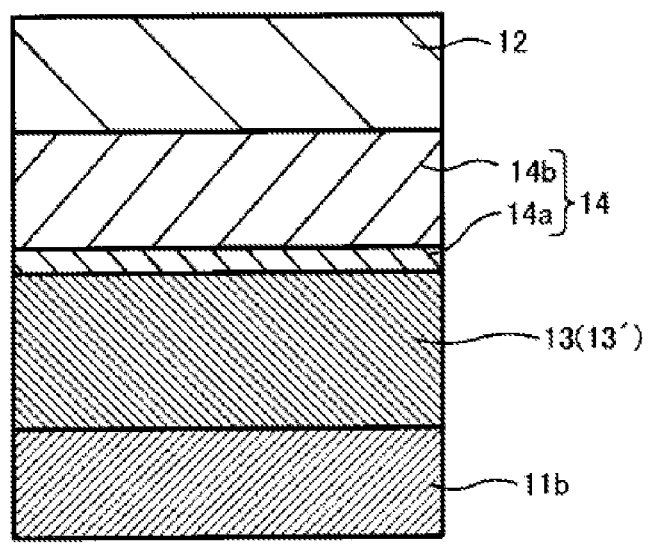

SEMICONDUCTOR DEVICE AND MANUFACTURING METHOD OF SEMICONDUCTOR DEVICE

CROSS-REFERENCE TO RELATED APPLICATION

This application is based upon and claims the benefit of priority from Japanese Patent Application No. 2012-205776, filed Sep. 19, 2012; the entire contents of which are incorporated herein by reference.

FIELD

Embodiments described herein relate to a semiconductor devices and a manufacturing method for the semiconductor devices.

BACKGROUND

Generally speaking, a semiconductor device having one or more semiconductor chips assembled on an underlying assembly substrate by solder joints made of a solder material is well known. For example, conventional semiconductor devices such as, transistors, diodes, capacitors, thyristors and other discrete semiconductor chips each having a single function are directly assembled on a substrate by creating solder joints between the devices and copper traces, pads, lines or copper lines holes in the underlying substrate. In addition, for modular type semiconductor chips, such as IC, LSI, System on Chip, etc., assembly of the chips to the substrate can be made by solder contacts between the copper lines, pads etc. on the substrate and metallization pads or bumps on the chip. In addition, heat sink unit and other members may also be joined by solder jointing thereof to the substrate on which the semiconductor chips are assembled.

Pb type and Pb—Sn type solders have long been used as the material for these solder joints. Recently, as a result of a desire to stop using, or limiting the use of, Pb based materials, Sn—Ag type and Sn—Ag—Cu type solder materials have been used to create the solder joints between chips and other devices and the underlying substrate. In particular, when the modular type semiconductor chips are assembled, the Pb type solder material with melting point at about 300° C. is adopted, and, when the heat sink and other members are assembled onto the substrate, a solder material with a relatively low melting point, e.g., 200° C. or lower, is used for their attachment thereto.

As devices such as chips are further miniaturized, and the output power of the electronic devices is increased, the heat generating rate per unit area of the semiconductor devices is increasing. For silicon (Si) semiconductor devices, usually, the operating temperature of the device is around 125° C., and its application temperature is about 200° C. That is, the Si semiconductor devices are used in the environment at temperatures of 300° C. or less. On the other hand, for the high power semiconductor devices made of SiC, GaN, etc., operation of the devices can be carried out with low loss even at a temperature 300° C. or more.

However, when the conventional semiconductor device prepared by assembling semiconductor chips on a substrate by a solder material is to operate in a high temperature environment, the solder material with a low melting point may be re-melted breaking the electrical connection between the semiconductor chips and the assembling substrate. This is undesirable. For semiconductor devices in the prior art, it is hard to work with a high stability in a high temperature environment, that is, the low heat resistance is a problem for them.

As for semiconductor devices with a high heat resistance, the following types of physically and electrically joining of the device to the underlying substrate are available: a semiconductor device prepared by assembling semiconductor chips on an assembling substrate by Au—Sn eutectic solder, and a semiconductor device prepared by assembling semiconductor chips on a substrate using a low temperature sintering method by exploiting Ag nano-grains. However, for the semiconductor devices manufactured using a lead-free high-heat-resistant jointing material, Au, Ag and other noble metals are used in a relatively large quantity, resulting in increased manufacturing cost. This is undesirable.

DESCRIPTION OF THE DRAWINGS

FIG. 1 is a cross-sectional view illustrating the semiconductor device according to a first embodiment.

FIG. 2 is an enlarged cross-sectional view illustrating the joint portion indicated by broken line in FIG. 1.

DETAILED DESCRIPTION

Figure 3:
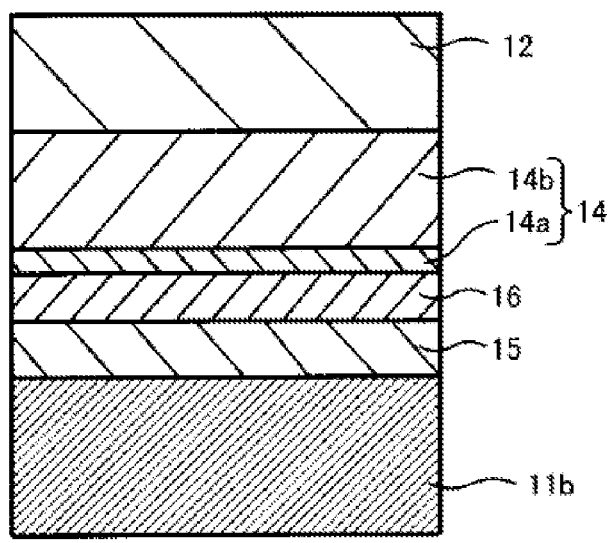
FIG. 3 is a cross-sectional view illustrating a step of operation in the manufacturing method of the semiconductor device according to the first embodiment.

In general, the embodiments herein will be explained with reference to figures.

The semiconductor device in an embodiment of the present invention has an underlying assembly substrate, a semiconductor chip, a jointing layer, and a soft metal layer. The semiconductor chip is joined on the assembly substrate via the jointing portion and the soft metal layer. The jointing layer is an alloy layer mainly made of any of the metal selected from Sn, Zn and In or an alloy of Sn, Zn and In, or any of the metal selected from Cu, Ni, Ag, Cr, Zr, Ti and V or an alloy made of any of the metal selected from Cu, Ni, Ag, Cr, Zr, Ti and V and any of the metal selected from Sn, Zn and In. The soft metal layer contains any of the metal selected from Cu, Al, Zn and Ag. The jointing layer is created in situ using a relatively high melting point material as a joint supporting layer, such as Cu, Ni, Ag, Cr, Zr, Ti and V, and a low melting point material as a fusing layer, such as Sn, Zn and In or an alloy of Sn, Zn and In, which are alloyed in situ to form a higher melting point jointing layer.

The manufacturing method of the semiconductor device according to the embodiment has a step of operation in which a fusing layer, a joint supporting layer, and a soft metal layer are laminated in this order between the assembly substrate and the semiconductor chip, and a step of operation in which the semiconductor chip is assembled on the assembly substrate. The fusing layer contains any of the metal selected from Sn, Zn and In or an alloy of Sn, Zn and In. The joint supporting layer contains any of the metal selected from Cu, Ni, Ag, Cr, Zr, Ti and V, or an alloy made of any of the metal selected from Cu, Ni, Ag, Cr, Zr, Ti, V and any of the metals selected from Sn, Zn and In. The soft metal layer contains any of the metals selected from Cu, Al, Zn and Ag. The semiconductor chip is assembled on the substrate as the fusing layer is converted to the liquid phase state, so that the metal or alloy contained in the fusing layer and the metal or alloy contained in the joint supporting layer diffusion with each other to form an alloy layer with melting point higher than that of the fusing layer.

The manufacturing method of the semiconductor device according to the embodiment has a step of operation in which the fusing layer, the joint supporting layer and the soft metal layer are sequentially formed on the assembly substrate and the semiconductor chip is located on the soft metal layer, and a step of operation in which the semiconductor chip is assembled in the assembly substrate using heat, and where desired, pressure. Additionally, the assembly substrate at least has a wiring layer containing Cu on its surface, and the fusing layer containing any of the metal selected from Sn, Zn and In or an alloy of Sn, Zn and In is directly contacted therewith. The semiconductor chip is assembled on the assembly substrate as the fusing layer is converted to the liquid phase state, so that the metal or alloy contained in the fusing layer and Cu contained in the wiring layer make mutual diffusion with each other to form an alloy layer with a melting point higher than that of the fusing layer.

First Embodiment

FIG. 1 is a cross-sectional view illustrating the semiconductor device according to the first embodiment. As shown in FIG. 1, the semiconductor device 10 is prepared by assembling a semiconductor chip 12 on an assembly substrate 11.

For example, the assembly substrate 11 has wiring layers 11b, 11c mainly made of, e.g., copper (Cu) formed on the outer surface and back surface of an insulating substrate 11a mainly made of, e.g., silicon nitride (SiN).

The semiconductor chip 12 is a high output semiconductor chip mainly made of, e.g., silicon nitride (SiN). The semiconductor chip 12 is assembled on the assembly substrate 11 as it is jointed to the wiring layer 11b of the assembly substrate 11 via a jointing layer 13 and a stress relieving layer 14.

FIG. 2 is an enlarged cross-sectional view illustrating the jointing portion surrounded with broken line x in FIG. 1. The jointing layer 13 shown in FIG. 2 is a layer having a melting point higher than the upper limit of the workable temperature of the semiconductor device 10. It is an alloy layer mainly made of an alloy formed by mutual diffusion of at least 2 types of metals or alloys. For example, suppose the upper limit of the workable temperature of the semiconductor device 10 is at 300° C., the jointing layer 13 may be made of an inter-metallic compound ($Cu_3Sn$, with melting point at 700° C.) formed by mutual diffusion of tin (Sn) and Cu.

There is no specific restriction on the thickness of the jointing layer 13. For example, the thickness may be about 10 µm or thinner.

Here, the alloy means a solid solution, an inter-metallic compound, or an intermediate layer including two or more types of metals as the main ingredients. The various metals contained in the alloy can be detected by analysis using, e.g., an X-ray spectroscope or an X-ray diffraction device.

A stress relieving layer 14 is arranged on the jointing layer 13. The stress relieving layer 14 is formed by sequentially depositing a diffusion barrier layer 14a on the materials which form the jointing layer and then a soft metal layer 14b thereover.

The soft metal layer 14b is a metal layer for relieving the stress applied on the jointing layer 13 and caused by the difference in the linear thermal expansion rate between the assembly substrate 11 and the semiconductor chip 12. For example, this layer may be mainly made of Cu or other metal that can easily make plastic deformation.

The thicker the soft metal layer 14b, the more the stress applied on the jointing layer 13 that can be relieved. Consequently, as the soft metal layer 14b is made thicker, the thickness of the soft metal layer 14b is increased, and, at the same time, the stress relieving ability can be increased. Consequently, it is preferred that the thickness of the soft metal layer be 1 µm or thicker.

The diffusion barrier layer 14a is a layer that can suppress denaturing of the soft metal layer 14b when the two types of metals or alloys that form the jointing layer 13 make mutual diffusion with each other. That is, it is a layer that can suppress mechanical/chemical changes of the soft metal layer 14b. For example, the diffusion barrier layer 14a may be mainly made of Ni (with melting point at 1453° C.).

It is preferred that the thickness of the diffusion barrier layer 14a be in the range of about 1 μm to 10 μm. If the thickness is within this range, it is possible to better suppress denaturing of the soft metal layer 14b.

As explained above, the semiconductor device 10 according to the embodiment has the semiconductor chip 12 assembled on the assembly substrate 11 by the jointing layer 13 and the stress relieving layer 14 shown in FIG. 2.

In the following, the manufacturing method of the semiconductor device 10 will be explained with reference to FIGS. 3 to 6. FIGS. 3 to 6 are cross-sectional views similar to FIG. 2 for explaining the manufacturing method of the semiconductor device according to the first embodiment.

As shown in FIG. 3, on the surface of the assembly substrate 11, at the prescribed position on the wiring layer 11b mainly made of, e.g., Cu, a fusing layer 15 mainly made of a low melting point metal, such as tin (Sn) (with melting point at 232° C.), a joint supporting layer 16 mainly made of a high melting point metal, such as Cu (melting point at 1,034° C.), and a stress relieving layer 14 (a diffusion barrier layer 14a mainly made of Ni and a soft metal layer 14b mainly made of a soft metal, such as Cu) are deposited such that they are laminated in this order on the substrate, and then the semiconductor chip 12 is located on the stress relieving layer 14 (on the soft metal layer 14b).

The fusing layer 15, the joint supporting layer 16, the diffusion barrier layer 14a, and the soft metal layer 14b may all be formed by plating methods. These various layers may also be formed using other methods, such sputtering, vapor deposition method, liquid coating method, and other thin film forming technologies. In addition to the forming methods, in particular, the fusing layer 15 may be formed by applying a metal foil to the substrate.

The fusing layer 15 and the joint supporting layer 16 are formed with thickness of, e.g., 0.1 to 100 μm, or preferably in the range of 1 to 10 μm, respectively. Also, the diffusion barrier layer 14a and the soft metal layer 14b are formed each with thickness in the range of 1 to 100 μm, or preferably in the range of 1 to 10 μm. In addition, for the diffusion barrier layer 14a, in order to suppress denaturing of the soft metal layer 14b over a long period of time, it is preferred that it be formed with thickness of 3 μm or thicker.

It is preferred that the fusing layer 15 and the joint supporting layer 16 be formed with their layer thickness ratio (thickness of the fusing layer/thickness of the joint supporting layer) of 1 or smaller. When the two layers are formed with such layer thickness ratio, it is possible to form the jointing layer 13 in a short time.

Figure 4:
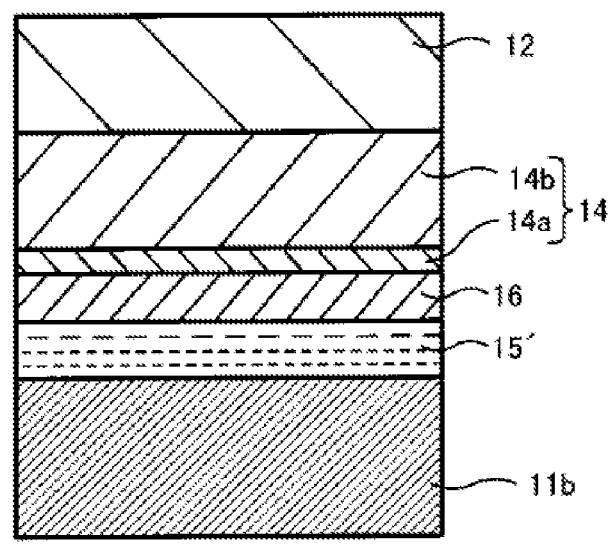
FIG. 4 is a cross-sectional view illustrating a step of operation in the manufacturing method of the semiconductor device according to the first embodiment.

Then, as shown in FIG. 4, as needed, for example, in an inert atmosphere, while a prescribed pressure is applied on the semiconductor chip 12 in the direction of the underlying assembly substrate 11, the assembly substrate 11 and the semiconductor chip 12 are heated, and these parts are held at a jointing temperature (such as 250° C.) higher than 232° C. or more, the melting point of the fusing layer 15 mainly made of Sn. As a result, only the fusing layer 15 is in the liquid phase state, and the jointing surfaces of the assembly substrate 11 (wiring layer 11b) and the joint supporting layer 16 in contact with the liquid fusing layer 15' and are wetted thereby.

In addition to Sn, the fusing layer 15 may also be made of other low melting point metals, such as zinc (Zn) or indium (In). Also, as the fusing layer 15, one may adopt a binary or tertiary alloy of Sn, Zn and In as the low melting point alloy. For example, when the fusing layer 15 is made of an In—Sn—Zn eutectic alloy (eutectic temperature: 108° C.), it is possible to decrease the jointing temperature to be explained later to 108° C., and it is possible to assemble the semiconductor chip 12 on the assembly substrate 11 at an even lower temperature.

In addition to Cu, the joint supporting layer 16 may also be made of anyone of the following metals: nickel (Ni), silver (Ag), chromium (Cr), zirconium (Zr), titanium (Ti), and vanadium (V). Also, the joint supporting layer 16 may be made of an alloy (such as an inter-metallic compound $Cu_3Sn$ made of Sn and Cu or the like) mainly made of one of the elements in the group of Cu, Ag, Ni, Cr, Zr, Ti and V and one of the elements in the group of Sn, Zn and In.

In addition, as the diffusion barrier layer 14a, in addition to Ni, anyone of the following elements may be adopted as well: chromium (Cr), molybdenum (Mo), tantalum (Ta), vanadium (V), and tungsten (W).

Also, in addition to Cu, the soft metal layer 14b may be made of anyone of the following metals that can easily deform sufficiently to compensate for thermal stress induced between the chip 12 and the underlying assembly substrate 11, such as aluminum (Al), Zn and Ag.

In this step of operation, the assembly substrate 11 and the jointing layer 13 are heated in an inert atmosphere. However, they may also be heated in a reductive atmosphere. As they are heated in the reductive atmosphere, it is possible to suppress oxidation of the formed jointing layer 13.

In this step of operation, the pressure applied on the semiconductor chip 12 should be appropriate not to damage the semiconductor chip 12. One may also adopt a scheme in which no pressure is applied.

Figure 5:
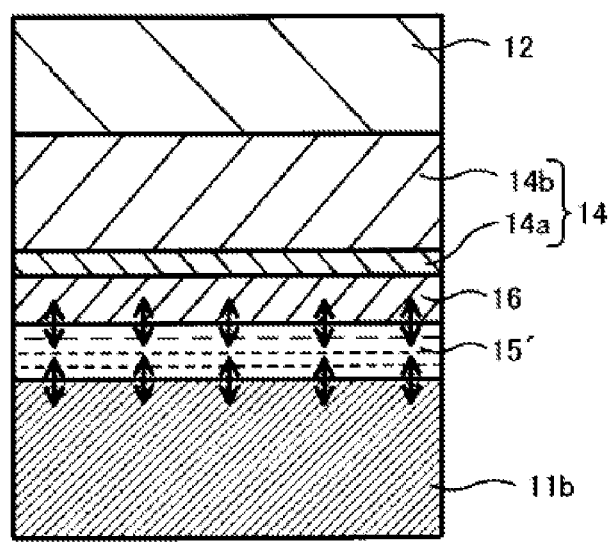
FIG. 5 is a cross-sectional view illustrating a step of operation in the manufacturing method of the semiconductor device according to the first embodiment.

Then, under heat and pressure, the fusing layer 15' is kept in the liquid phase state for a prescribed time, so that as shown in FIG. 5, mutual diffusion takes place so that the ingredient (Cu) of the wiring layer 11b and the joint supporting layer 16 and the fusing layer 15' (Sn) in the liquid phase state are interdiffused.

Figure 6:
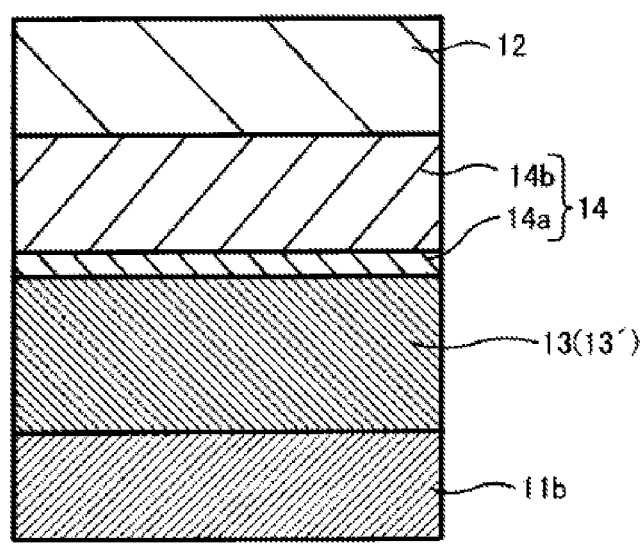
FIG. 6 is a cross-sectional view illustrating a step of operation in the manufacturing method of the semiconductor device according to the first embodiment.

Due to the mutual diffusion, the fusing layer 15' in the liquid phase state is fully consumed and alloyed into the adjacent joint supporting layer 16 and wiring layer 11b on the substrate 11, and, as shown in FIG. 6, between the assembly substrate 11 (wiring layer 11b) and the stress relieving layer 14, a jointing layer 13 mainly made of the alloy (such as $Cu_3Sn$) containing Sn, Cu is formed by isothermal solidification alloying the fusing and joint supporting layer together. The thus formed jointing layer 13 has a melting point (for example, the melting point of $Cu_3Sn$ is at 700° C.) higher than the melting point of the fusing layer 15 (for example, the melting point of Sn is at 232° C.), and, at the same time, the melting point is higher than 300° C., the upper limit of the workable temperature for the semiconductor device 10. With such jointing layer 13, the semiconductor chip 12 and the wiring layer 11b of the assembly substrate 11 are jointed with each other.

In addition, as shown in FIG. 5, the fusing layer 15' in the liquid phase state is sandwiched between the wiring layer 11b and the joint supporting layer 16, so that the diffusion takes place on both surfaces of the fusing layer 15'. As a result, it is possible to form the jointing layer 13 in a short time.

As explained above, by jointing the semiconductor chip 12 and the wiring layer 11b of the assembly substrate 11 by the jointing layer 13, the semiconductor chip 12 is assembled on the assembly substrate 11, and the semiconductor device 10 according to this embodiment is manufactured. In the following, the jointing layer 13 formed here will be explained in more detail.

Figure 7:
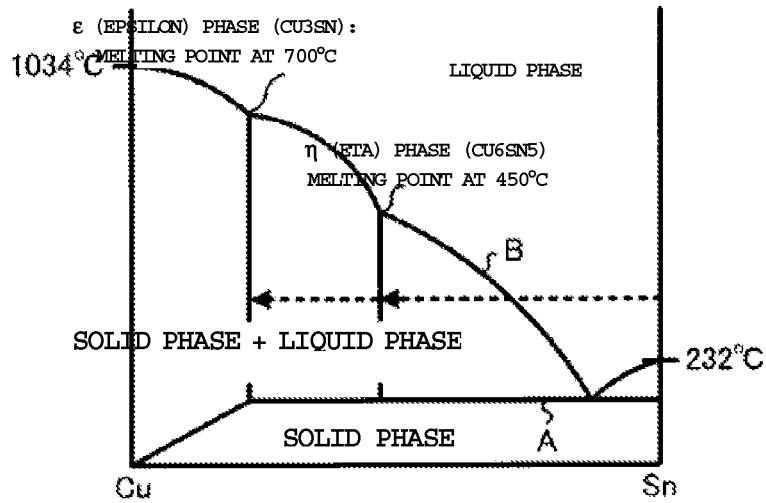
FIG. 7 is a diagram illustrating the state of Sn and Cu.

FIG. 7 is a phase diagram illustrating the possible phases of an alloy of Sn and Cu. In the figure, the abscissa represents the proportions of the two metals contained in the alloy. The left hand side of the abscissa corresponds to higher proportion of Cu in the alloy (the right hand side of the abscissa corresponds to higher proportion of Sn in the alloy). The ordinate in the figure represents the temperature. The upper side in the figure corresponds to a higher temperature. In the figure, straight line A indicates the temperature at which the state of the alloy changes between the solid phase and the liquid phase+the solid phase. Curve B indicates the temperature (melting point) at which the state of the alloy changes between the liquid phase+the solid phase and the liquid phase.

As shown in FIG. 7, except the case when the proportion of Cu with respect to Sn is minute, i.e., very small, for the alloy mainly made of Cu and Sn, the melting point of the alloy increases as the proportion of the Cu in the alloy becomes higher. At a temperature (e.g., 250° C.) higher than the melting point of Sn, Sn is melted, and, by mutual diffusion between Sn and Cu, the inter-metallic compound of the η-phase ($Cu_6Sn_5$) is formed, and the melting point of this inter-metallic compound is at 450° C. While the temperature is maintained (e.g., the jointing temperature) higher than the melting point of Sn, mutual diffusion takes place, and an inter-metallic compound in ε-phase ($Cu_3Sn$) with the proportion of Cu higher than that of the η-phase inter-metallic compound is formed, and the melting point of this inter-metallic compound becomes 700° C.

Also, due to the mutual diffusion of Sn and Cu, it is possible to form the η-phase inter-metallic compound and the ε-phase inter-metallic compounds are formed nearly simultaneously: First the η-phase is formed and rather quickly, the ε-phase inter-metallic compound will be formed.

Figure 8A:
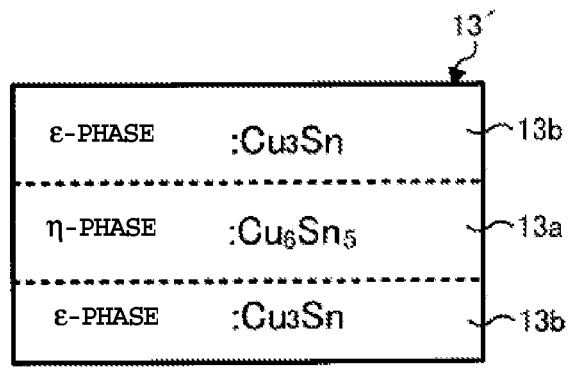
FIGS. 8A and 8B are diagrams illustrating in more detail the jointing layer.
Figure 8B:
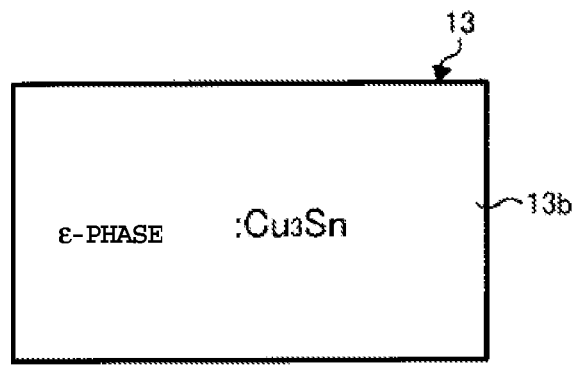

FIG. 8A and FIG. 8B are diagrams illustrating in more detail the jointing layer 13. Due to the mutual diffusion between the Cu ingredient in the wiring layer 11b and the joint supporting layer 16 and the Sn ingredient in the fusing layer 15' melted in liquid phase state, as shown in FIG. 8A, with the region where the fusing layer 15' is present at the center, the η-phase inter-metallic compound 13a ($Cu_6Sn_5$) (melting point at 450° C.) is formed, and, with the region where the wiring layer 11b and the joint supporting layer 16 are present at the center, the ε-phase inter-metallic compound 13b ($Cu_3Sn$) (melting point at 700° C.) is formed. As a result, the ε-phase inter-metallic compound 13b, the η-phase inter-metallic compound 13a, and the ε-phase inter-metallic compound 13b are laminated in this order to form the jointing layer 13'.

However, the η-phase inter-metallic compound 13a is unstable. Consequently, after formation of the jointing layer 13' with the structure shown in FIG. 8A, in the manufacturing process of the semiconductor device 10, the mutual diffusion continues to progress between Cu and Sn, and, after manufacturing of the semiconductor device 10 having the jointing layer 13' with the structure shown in FIG. 8A, due to the thermal hysteresis induced on the jointing layer 13' by thermal cycling associated with the use of semiconductor device 10, the mutual inter-diffusion of Cu and Sn continues, and finally, as shown in FIG. 8B, a jointing layer 13 entirely made of the ε-phase inter-metallic compound 13b is formed.

That is, in the semiconductor device 10 manufactured using the manufacturing method of the semiconductor device 10; the semiconductor chip 12 is assembled on the assembly substrate 11 by either the jointing layer 13' shown in FIG. 8A or the jointing layer 13 shown in FIG. 8B. However, even when the semiconductor chip 12 is assembled on the assembly substrate 11 by the jointing layer 13' shown in FIG. 8A, due to the thermal cycling or the like related to the semiconductor device 10 after that, finally, the semiconductor chip 12 is assembled on the assembly substrate 11 by the jointing layer 13 shown in FIG. 8B to form the semiconductor device 10.

The melting point of the jointing layer 13' shown in FIG. 8A is at 450° C., the melting point of the η-phase inter-metallic compound 13a which phase has the lower melting point among the ε-phase inter-metallic compound 13b and the η-phase inter-metallic compound 13a. In addition, the melting point of the jointing layer 13 shown in FIG. 8B is at 700° C., the melting point of the ε-phase inter-metallic compound 13b. Suppose the upper limit of the workable temperature for the semiconductor device 10 according to the embodiment is at 300° C., the melting temperatures of the different phases of the jointing layer 13 are sufficiently above that of the semiconductor device 10 operating temperature. Consequently, even for the semiconductor device 10 where the wiring layer 11b of the assembly substrate 11 and the semiconductor chip 12 are jointed with each other by the jointing layer 13' shown in FIG. 8A, and, even for the semiconductor device 10 having the wiring layer 11b of the assembly substrate 11 and the semiconductor chip 12 are jointed with each other by the jointing layer 13 shown in FIG. 8B, the wiring layer 11b of the assembly substrate 11 still can be jointed to the semiconductor chip 12 by the jointing layer 13, 13' with a melting point significantly higher than 300° C., the upper limit of the workable temperature for the semiconductor device 10.

As explained above, according to the first embodiment, the semiconductor chip 12 is assembled on the assembly substrate 11 by the jointing layer 13, 13' with a melting point higher than 300° C., the upper limit of the workable temperature for the semiconductor device 10 (the melting point of $Cu_6Sn_5$ is at about 450° C., and the melting point of $Cu_3Sn$ is at about 700° C.). Consequently, even when utilized in an environment higher than 300° C., it is still possible to suppress re-melting of the jointing layer 13, 13', so that stable operation can be carried out even in an environment at 300° C. or higher. Consequently, it is possible to provide a semiconductor device with a high heat resistance and a manufacturing method of the semiconductor device with a high heat resistance.

According to the first embodiment, the soft metal layer 14b is arranged on the jointing layer 13, 13'. Consequently, it is possible to provide a semiconductor device with a high reliability and a manufacturing method of the semiconductor device with a high reliability. That is, when the manufactured semiconductor device 10 is utilized in an environment at a high temperature, a stress is applied on the jointing layer 13, 13' due to the difference in the linear thermal expansion rate between the semiconductor chip 12 and the assembly substrate 11. However, because the soft metal layer 14b is arranged on the jointing layer 13, 13', the soft metal layer 14b can relax the stress applied on the jointing layer 13, 13'. Consequently, it is possible to provide a semiconductor device with a high reliability and a manufacturing method of the semiconductor device with a high reliability.

Also, according to the first embodiment, a diffusion barrier layer 14a is arranged between the soft metal layer 14b and the jointing layer 13, 13'. Consequently, when the jointing layer 13, 13' is formed, due to the thermal hysteresis after manufacturing of the semiconductor device, it is possible to suppress the ingredient (Sn) of the fusing layer 15 from entering the soft metal layer 14b. That is, when the jointing layer 13, 13' is formed, due to the thermal hysteresis after manufacturing of the semiconductor device, a portion of the ingredient (Sn) of the fusing layer 15 can easily be diffused in the joint supporting layer 16, and it can reach the boundary face between the joint supporting layer 16 and the diffusion barrier layer 14a. However, by the diffusion barrier layer 14a, further diffusion of Sn is suppressed, and diffusion of Sn to the soft metal layer 14b can be suppressed. Consequently, the integrity of the soft metal layer 14b may be maintained, and it is possible to provide a semiconductor device with a high reliability and a manufacturing method of the semiconductor device with a high reliability.

Also, according to the first embodiment, the fusing layer 15, the joint supporting layer 16, the diffusion barrier layer 14a and the soft metal layer 14b can be made of metals other than the noble metals. Consequently, it is possible to manufacture the semiconductor device at a lower cost as compared to where the noble metals have been employed.

Alternatively, the joint supporting layer 16 and the soft metal layer 14b may be layers mainly made of Ag, respectively. However, these layers may be as thin as about 10 μm or thinner. Consequently, the quantity of Ag adopted here is small, so that the semiconductor device can be manufactured at a lower cost even when a metal mainly made of Ag is adopted in making the joint supporting layer 16 and the soft metal layer 14b.

On the other hand, for the conventional semiconductor device that has the semiconductor chip assembled on the assembly substrate by Au—Sn eutectic solder, the Au—Sn eutectic solder as the jointing portion usually should have a thickness of about 30 to 50 μm, and such thick jointing portion is made of Au, much more expensive than Ag. Consequently, a high cost is needed for manufacturing the semiconductor device in the prior art.

Also, for the conventional semiconductor device that has a semiconductor chip assembled on an assembly substrate using the low temperature sintering method using Ag nano-grains, too, usually a jointing portion containing Ag with thickness of about 30 to 50 μm is needed, so that a large quantity of Ag should be used. In addition, when the conventional semiconductor device is manufactured, a step of operation for forming the nano-grains from the Ag feed material is needed. Consequently, when the conventional semiconductor device is manufactured, a significant cost is encountered.

Second Embodiment

The semiconductor device according to the second embodiment differs from the semiconductor device 10 according to the first embodiment in the structure of the jointing portion. In the following, as an explanation of the semiconductor device according to the second embodiment, the jointing portion of the semiconductor device will be explained with reference to FIG. 9.

Figure 9:
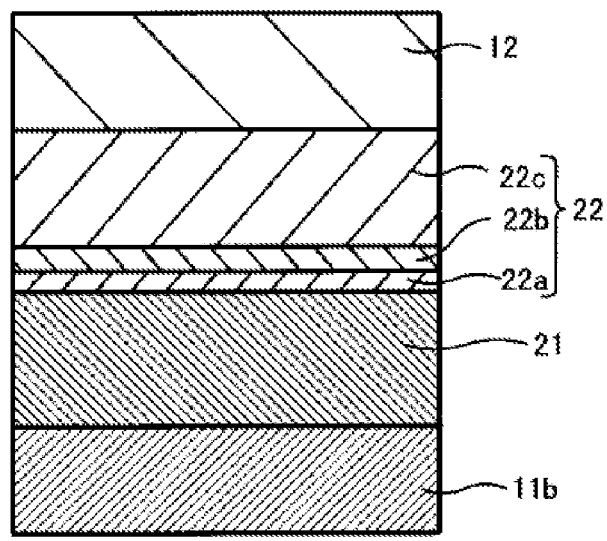
FIG. 9 is an enlarged cross-sectional view illustrating the jointing portion of the semiconductor device according to a second embodiment.

FIG. 9 is an enlarged cross-sectional view illustrating the jointing portion of the semiconductor device according to the second embodiment. The semiconductor device according to this embodiment has the assembly substrate 11 and the semiconductor chip 12 identical to those in the semiconductor device according to the first embodiment. Here, the same keys as those in the above are adopted, and they will not be explained in detail again. Also, the embodiment of FIG. 9 is shown post processing, i.e., after the structure or stack of joint supporting and fusing layers of FIG. 3 are heated to form the alloyed layer 13 shown in FIG. 6, which is layer 21 in FIG. 9.

As shown in FIG. 9, in the jointing portion of the semiconductor device according to the second embodiment, the following layers are laminated sequentially to form a stress relieving layer 22 between the jointing layer 21 and the semiconductor chip 12: a joint supporting layer 22a, a diffusion barrier layer 22b, and a soft metal layer 22c.

The jointing layer 21 has the same constitution as that of the jointing layer 13, 13' according to the first embodiment, and it may have a thickness of about 10 μm or more.

The stress relieving layer 22 differs from the stress relieving layer 14 according to the first embodiment in that it has the joint supporting layer 22a as the bottom layer.

That is, for the semiconductor device according to this embodiment, the semiconductor chip 12 is assembled on the assembly substrate 11 as it is jointed with the wiring layer 11b of the assembly substrate 11 via the jointing layer 21 and the stress relieving layer 22.

As compared to the structure of layers prior to heating of the layers as shown in FIG. 3, in this embodiment, the joint supporting layer 16 was originally formed thicker than that of FIG. 3, or the period of heating to enable diffusion between the joint supporting and fusing layers was shortened, so that a portion of the joint supporting layer 16 is left when the jointing layer 21 is formed. The residual joint supporting layer 16 becomes the joint supporting layer 22a according to this embodiment.

Also in the second embodiment, the semiconductor chip 12 is assembled on the assembly substrate 11 by the jointing layer 21 with a melting point higher than 300° C., the upper limit of the workable temperature for the semiconductor device (the melting point of $Cu_6Sn_5$ is at about 450° C., and the melting point of $Cu_3Sn$ is at about 700° C.). Consequently, it is possible to provide a semiconductor device with a high heat resistance and a manufacturing method of the semiconductor device with a high heat resistance.

Also, because the stress relieving layer 22 containing the soft metal layer 22c and the diffusion barrier layer 22b is arranged on the jointing layer 21, it is possible to provide a semiconductor device with a high reliability and a manufacturing method of the semiconductor device with a high reliability.

Just as in the first embodiment, in the second embodiment the fusing layer 15, the joint supporting layer 16 (22a), the diffusion barrier layer 22b and the soft metal layer 22c may be made of metals other than the noble metals. Consequently, it is possible to manufacture the semiconductor device at a lower cost.

In the above, the manufacturing method of the semiconductor device according to the second embodiment has been explained. However, one may also adopt a scheme in which the joint supporting layer 16 (22a) and the soft metal layer 22c are each layers mainly made of Ag. These layers may be as thin as about 10 μm or thinner. Consequently, only a small quantity of Ag should be used, and, even when a metal mainly made of Ag is adopted as the joint supporting layer 16 (22a) and the soft metal layer 22c, it is still possible to manufacture the semiconductor device at a lower cost as compared with the conventional semiconductor device assembled using the Au—Sn eutectic solder and the conventional semiconductor device assembled with the low temperature sintering method using the Ag nano-grains.

In addition, according to the second embodiment, a joint supporting layer 22a is arranged between the jointing layer 21 and the diffusion barrier layer 22b. For example, when Cu or other soft metal is adopted as the joint supporting layer 22a, just as the soft metal layer 22c, the joint supporting layer 22a also can relieve the stress applied on the jointing layer 21. Consequently, it is possible to provide a semiconductor device with a high reliability and a manufacturing method of the semiconductor device with a high reliability.

When the semiconductor device having the jointing portion (jointing layer 21 and remaining joint supporting layer 22a) as shown in FIG. 9 is manufactured, for the manufactured semiconductor device, due to thermal hysteresis or the like, mutual diffusion makes further progress between Sn and Cu, so that the remaining Sn intermixed in the joint supporting layer 22a causes further alloying, to convert the joint supporting layer 22a into jointing layer 21. That is, it is possible to have the joint supporting layer 22a left at least in the semiconductor device right after manufacturing, so that it is possible to further improve the reliability at least for the semiconductor device right after manufacturing.

Third Embodiment

Figure 10:
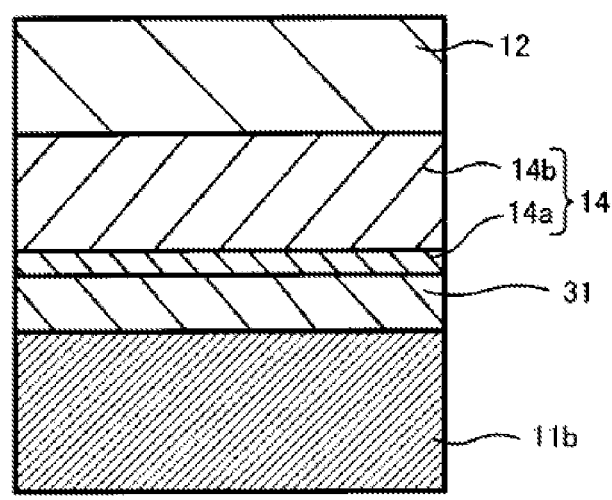
FIG. 10 is a cross-sectional view illustrating a step of operation in the manufacturing method of the semiconductor device according to a third embodiment.
Figure 11:
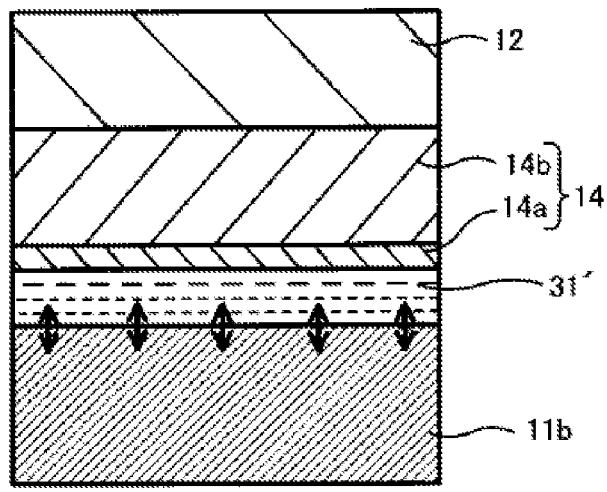
FIG. 11 is a cross-sectional view illustrating a step of operation in the manufacturing method of the semiconductor device according to the third embodiment.
Figure 12:
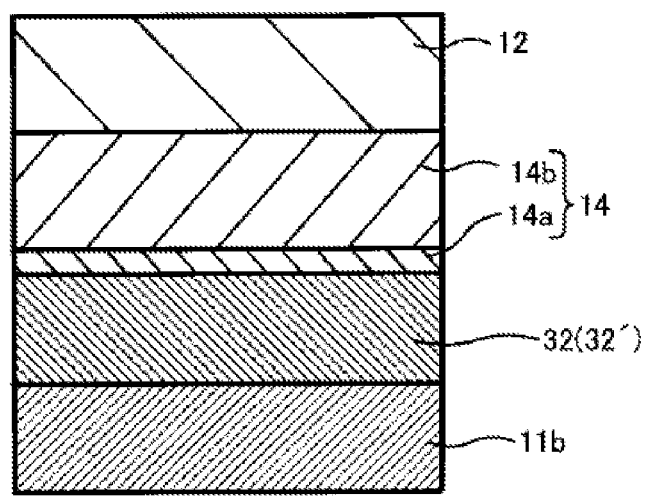
FIG. 12 is a cross-sectional view illustrating a step of operation in the manufacturing method of the semiconductor device according to the third embodiment.

In the following, the semiconductor device according to the third embodiment will be explained. First of all, the manufacturing method of the semiconductor device according to the third embodiment will be explained with reference to FIGS. 10, 11 and 12. Here, FIGS. 10, 11 and 12 are cross-sectional views each illustrating a step of operation in the manufacturing method of the semiconductor device according to the third embodiment. The assembly substrate 11, the semiconductor chip 12 and the stress relieving layer 14 are the same as those in the first embodiment, and the same keys as those in the above are adopted and will be omitted.

According to this manufacturing method, first of all, as shown in FIG. 10, on the wiring layer 11b of the assembly substrate 11, the fusing layer 31, the diffusion barrier layer 14a, and the soft metal layer 14b are deposited or formed in this order. The fusing layer 31 is the same metal layer as the fusing layer 15 when the semiconductor device 10 according to the first embodiment is manufactured.

As shown in FIG. 3, in the manufacturing method of the semiconductor device 10 according to the first embodiment, the joint supporting layer 16 is arranged between the fusing layer 15 and the soft metal layer 14b. On the other hand, in this embodiment the joint supporting layer is omitted.

Then, as shown in FIG. 11, the fusing layer 31 is converted to the liquid phase state by heating the substrate 11, thereby converting or melting the fusing layer 31' to the liquid phase state, the faces of the wiring layer 11b on the assembly substrate 11 and the stress relieving layer 14 (diffusion barrier layer 14a) in contact with the fusing layer 31' are wetted.

By keeping the fusing layer 31' in the liquid phase state for a prescribed time, mutual diffusion takes place so that the ingredient (Cu) of the wiring layer 11b and of the liquid fusing layer 31' (Sn) are interdiffused.

Due to the mutual diffusion, the fusing layer 31' in the liquid phase state is annihilated and as shown in FIG. 12, between the assembly substrate 11 (wiring layer 11b) and the stress relieving layer 14, a jointing layer 32 mainly made of an alloy containing the isothermally solidified Sn and Cu from the underlying assembly substrate 11 is formed. The jointing layer 32 formed in this case joints the semiconductor chip 12 and the wiring layer 11b of the assembly substrate 11.

Figure 13A:
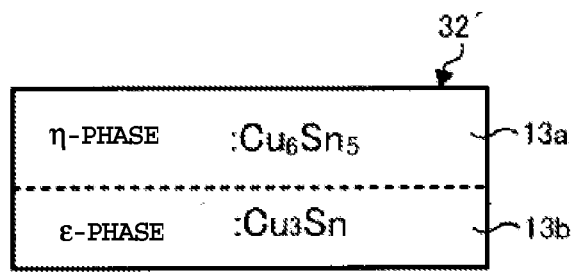
FIGS. 13A and 13B are diagrams illustrating in more detail the jointing layer of the semiconductor device according to the third embodiment.
Figure 13B:
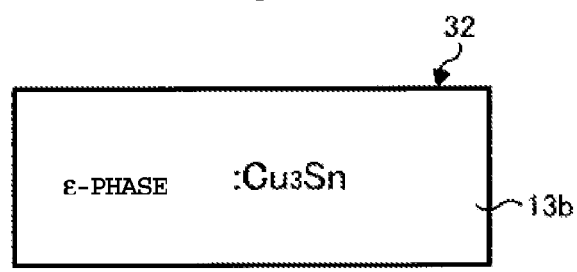

In the following, the structure of the jointing layer 32 of the semiconductor device manufactured using the method will be explained with reference to FIGS. 13A and 13B. Here, FIGS. 13A and 13B are diagrams illustrating in detail the jointing layer 32. Due to the mutual diffusion between the Cu ingredient of the wiring layer 11b and the Sn ingredient of the fusing layer 31' that is melted to the liquid phase state, as shown in FIG. 13A, with the region where the fusing layer 31' is present at the center, the η-phase inter-metallic compound 13a ($Cu_6Sn_5$) is formed, and, with the region where the wiring layer 11b is present at the center, the ε-phase inter-metallic compound 13b ($Cu_3Sn$) is formed. As a result the ε-phase inter-metallic compound 13b and the η-phase inter-metallic compound 13a are laminated in this order to form the jointing layer 32'.

However, after formation of the jointing layer 32' shown in FIG. 13A, in the process of manufacturing of the semiconductor device, the mutual diffusion between Cu and Sn progresses. In addition, after manufacturing of the semiconductor device having the jointing layer 32' shown in FIG. 13A, due to thermal cycling of the semiconductor device, the mutual diffusion between Cu and Sn further progresses. Finally, as shown in FIG. 13B, a jointing layer 32 comprised of all or nearly all ε-phase inter-metallic compound 13b is formed. The structure of the jointing layer 32 is the same as that of the jointing layer 13 shown in FIG. 8B.

That is, for the semiconductor device right after manufacturing using the manufacturing method of the semiconductor device according to the third embodiment, the semiconductor chip 12 is assembled on the assembly substrate 11 by either the jointing layer 32' shown in FIG. 13A or the jointing layer 32 shown in FIG. 13B. Even when the semiconductor chip 12 is assembled on the assembly substrate 11 by the jointing layer 32' shown in FIG. 13A, due to the thermal hysteresis or the like related to the semiconductor device 10 after that, finally, the semiconductor chip 12 is assembled on the assembly substrate 11 by the jointing layer 32 shown in FIG. 13B to form the semiconductor device.

In this way, the semiconductor device according to the third embodiment differs from the semiconductor device 10 according to the first embodiment in that it has a different structure of the jointing layer 32'.

In addition, the formed jointing layers 32, 32' may have a thickness of about 10 μm or thinner.

According to the third embodiment, the semiconductor chip 12 is jointed with the wiring layer 11b of the assembly substrate 11 by either the jointing layer 32' with a melting point at about 450° C., the melting point of $Cu_6Sn_5$, or the jointing layer 32 with a melting point at about 700° C., the melting point of $Cu_3Sn$. The melting points of the jointing layers 32, 32' are higher than 300° C., the upper limit of the workable temperature for the semiconductor device, so that it is possible to provide a semiconductor device with a high heat resistance and a manufacturing method of the semiconductor device with a high heat resistance.

In addition, as the stress relieving layer 14 containing the soft metal layer 14b and the diffusion barrier layer 14a is arranged on the jointing layer 32 or 32', it is possible to provide a semiconductor device with a high reliability and a manufacturing method of the semiconductor device with a high reliability.

Just as in the first embodiment, according to the third embodiment, the fusing layer 31, the diffusion barrier layer 14a and the soft metal layer 14b can be made of metals other than the noble metals, so that it is possible to manufacture the semiconductor device at a lower cost.

As explained in the above in the first and second embodiments the soft metal layer 14b may be a layer mainly made of Ag. It may be as thin as about 10 μm or thinner. Consequently, a small quantity of Ag is enough so that even a metal mainly made of Ag is adopted as the soft metal layer 22c, it is still possible to manufacture the semiconductor device at a lower cost than the conventional semiconductor device assembled using the Au—Sn eutectic solder or the conventional semiconductor device assembled with the low temperature sintering method using the Ag nano-grains.

In addition, according to the third embodiment, the jointing layers 32, 32' are formed without using a joint supporting layer. Consequently, compared with the manufacturing method of the semiconductor device 10 according to the first embodiment, it is possible to reduce the number of the steps of operation of manufacturing, and it is easier to manufacture the semiconductor device.

Fourth Embodiment

Figure 14:
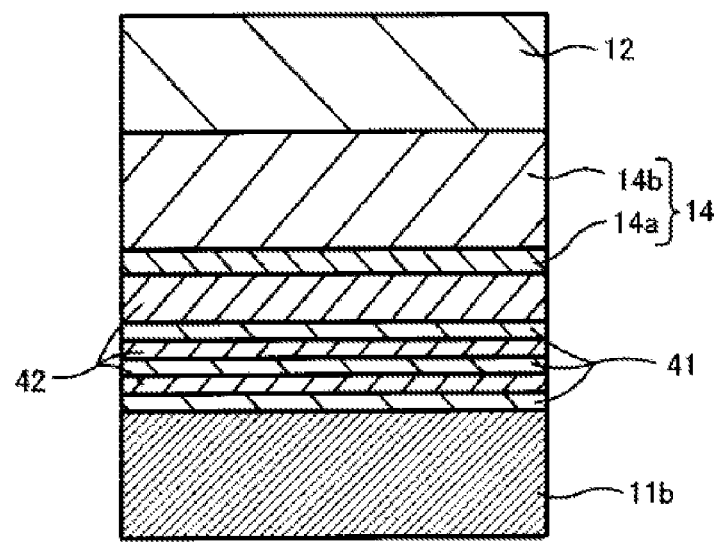
FIG. 14 is a cross-sectional view illustrating a step of operation in the manufacturing method of the semiconductor device according to a fourth embodiment.
Figure 15:
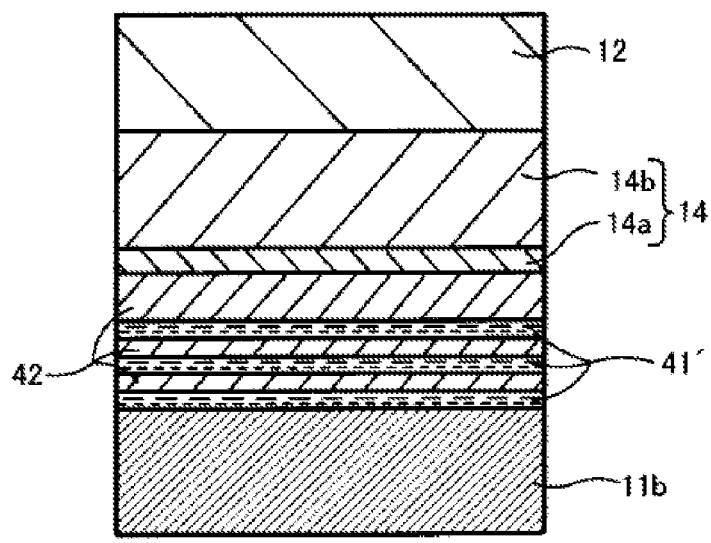
FIG. 15 is a cross-sectional view illustrating a step of operation in the manufacturing method of the semiconductor device according to the fourth embodiment.
Figure 16:
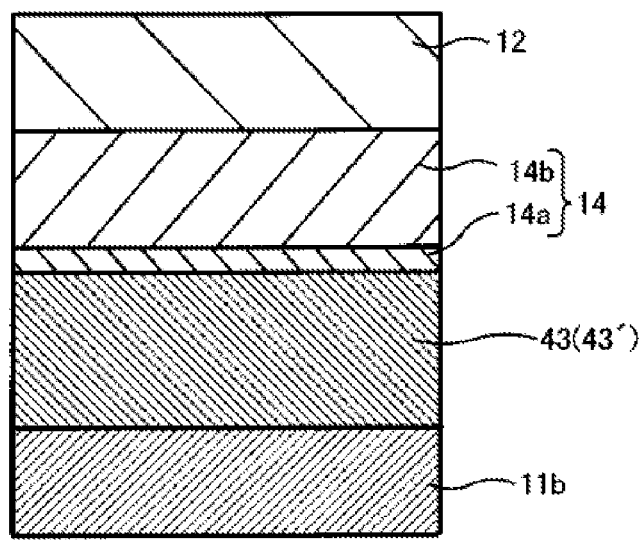
FIG. 16 is a cross-sectional view illustrating a step of operation in the manufacturing method of the semiconductor device according to the fourth embodiment.

Before explanation of the semiconductor device according to the fourth embodiment, first of all, the manufacturing method of the semiconductor device according to the fourth embodiment will be explained with reference to FIGS. 14, 15 and 16. Here, the FIGS. 14, 15 and 16 are cross-sectional views illustrating the steps of operation in manufacturing of the semiconductor device according to the fourth embodiment. Here, the assembly substrate 11, the semiconductor chip 12 and the stress relieving layer 14 are the same as those in the first embodiment so that the same keys as those in the above are adopted and they will not be explained in detail again.

According to this manufacturing method as shown in FIG. 14, on the wiring layer 11b of the assembly substrate 11, the fusing layer 41 and the joint supporting layer 42 are deposited or formed in this order repeatedly, in the illustrated embodiment 3 times, such that three stacks comprised of a jointing layer and a fusing layer are formed one a=over the other, and the stress relieving layer 14 (the diffusion barrier layer 14a and the soft metal layer 14b) is formed over the last formed joint supporting layer 42 as the top layer. Then, the semiconductor chip 12 is positioned on the stress relieving layer 14 (on the soft metal layer 14b). Each fusing layer 31 is the same metal layer as the fusing layer 15 in manufacturing the semiconductor device 10 according to the first embodiment, and each joint supporting layer 42 is of the same metal layer as the fusing layer 16 adopted when the semiconductor device 10 according to the first embodiment is manufactured.

Here, the total layer thickness of the plural fusing layers 41 is similar to the layer thickness of the fusing layer 15 used in manufacturing the semiconductor device 10 according to the first embodiment. That is, suppose the layer thickness of the fusing layer 15 according to the first embodiment is t, the layer thickness of each of the fusing layers 41 in the manufacturing method of the semiconductor device in this embodiment is about t/3. In the example three fusing layers 41 are arranged. Generally speaking, if n fusing layers 41 are arranged, the layer thickness of each of the fusing layers 41 is about t/n.

For the layer thickness of each of the joint supporting layers 42, the ratio of layer thickness of each of the fusing layers 41 to the layer thickness of each of the joint supporting layers 42 (thickness of the fusing layer/thickness of the joint supporting layer) is preferably 1 or smaller.

Then, as shown in FIG. 15, each of the fusing layers 41 is converted to the liquid phase state, and, by each fusing layers 41' in the liquid phase state, the jointing surfaces of the assembly substrate 11 (the wiring layer 11b), the joint supporting layer 42 and the stress relieving layer 14 (the diffusion barrier layer 14a) in contact with the fusing layers 41' are wetted.

By keeping the fusing layers 41' in the liquid phase state for a prescribed time, the mutual diffusion takes place so that the ingredient (Cu) of the wiring layer 11b and the joint supporting layer 42 is dissolved in the fusing layers 41' (Sn) in the liquid phase state.

Due to the mutual diffusion, the fusing layer 41' in the liquid phase state is subsumed into the alloy, and, as shown in FIG. 16, between the assembly substrate 11 (wiring layer 11b) and the stress relieving layer 14, a jointing layer 43 mainly made of the alloy containing Sn, Cu that are isothermally solidified. The formed jointing layer 43 joins the semiconductor chip 12 and the wiring layer 11b of the assembly substrate 11.

Figure 17A:
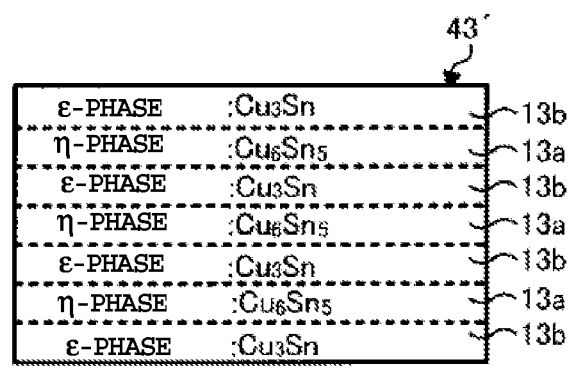
FIGS. 17A and 17B are diagrams illustrating in more detail the jointing layer of the semiconductor device according to the fourth embodiment.
Figure 17B:
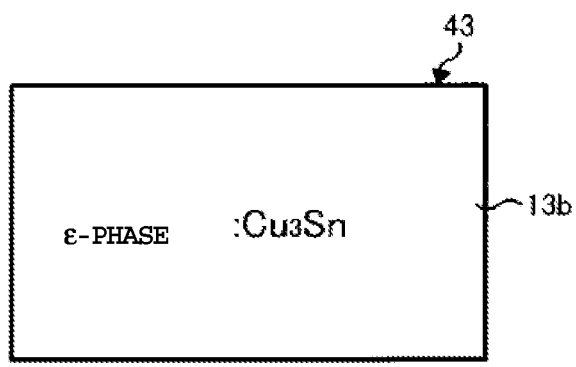

In the following, the structure of the jointing layer 43 of the semiconductor device manufactured using this method will be explained with reference to FIGS. 17A and 17B. Here, FIGS. 17A, 17B are diagrams for explaining the jointing layer 43 in more detail. Due to the mutual diffusion between the Cu ingredient of the wiring layer 11b and the joint supporting layer 42 and the Sn ingredient of the fusing layers 41' melted to the liquid phase state, as shown in FIG. 17A, with the region where the fusing layer 41' exists at the center, the η-phase inter-metallic compound 13a ($Cu_6Sn_5$) is formed and with the region where the wiring layer 11b and the joint supporting layer 42 exist at the center, the ε-phase inter-metallic compound 13b ($Cu_3Sn$) is formed. As a result, the ε-phase inter-metallic compound 13b and the η-phase inter-metallic compound 13a are formed in this order repeatedly in 3 segments, and, on the η-phase inter-metallic compound 13a as their top layer, the ε-phase inter-metallic compound 13b is laminated to form the jointing layer 43'.

However, after formation of the jointing layer 43' shown in FIG. 17A, in the process of manufacturing of the semiconductor device, the mutual diffusion between Cu and Sn progresses. In addition, after manufacturing of the semiconductor device having the jointing layer 43' shown in FIG. 17A, due to the thermal hysteresis, etc. applied on the semiconductor device, the mutual diffusion between Cu and Sn further progresses. Finally, as shown in FIG. 17B, the jointing layer 43 made of only, or nearly only, the ε-phase inter-metallic compound 13b is formed. The structure of the jointing layer 43 is the same as that of the jointing layer 13 shown in FIG. 8B.

That is, for the semiconductor device right after manufacturing using the manufacturing method of the semiconductor device according to the fourth embodiment, the semiconductor chip 12 is assembled on the assembly substrate 11 by either the jointing layer 43' shown in FIG. 17A or the jointing layer 43 shown in FIG. 17B. Even when the semiconductor chip 12 is assembled on the assembly substrate 11 by the jointing layer 43' shown in FIG. 17A, due to thermal cycling of the semiconductor device thereafter, the ε-phase inter-metallic jointing layer 43 shown in FIG. 17B ultimately results.

In this way, the semiconductor device according to the fourth embodiment differs from the semiconductor device 10 according to the first embodiment in that it has a different structure of the jointing layer 43'.

In addition, the jointing layers 43, 43' may have a thickness of about 10 μm or thinner.

According to the fourth embodiment, the semiconductor chip 12 is joined with the wiring layer 11b of the assembly substrate 11 by either the jointing layer 43' with a melting point at about 450° C., the melting point of $Cu_6Sn_5$, or the jointing layer 43 with a melting point at about 700° C., the melting point of $Cu_3Sn$. The melting points of the jointing layers 43, 43' are higher than 300° C., the upper limit of the workable temperature for the semiconductor device, so that it is possible to provide a semiconductor device with a high heat resistance and a manufacturing method of the semiconductor device with a high heat resistance.

In addition, as the stress relieving layer 14 containing the soft metal layer 14b and the diffusion barrier layer 14a is arranged on the jointing layer 43 or 43', it is possible to provide a semiconductor device with a high reliability and a manufacturing method of a semiconductor device with high reliability.

Just as in the first embodiment, according to the fourth embodiment, the fusing layers 41, the joint supporting layers 42, the diffusion barrier layer 14a and the soft metal layer 14b can be made of metals other than the noble metals so that it is possible to manufacture the semiconductor device at a lower cost. The plural joint supporting layers 42 and the soft metal layer 14b may also be layers mainly made of Ag. The total layer thickness of the plural joint supporting layers 42 and the layer thickness of the soft metal layer 14b may be as thin as about 10 μm or thinner, so that it is possible to manufacture the semiconductor device at a lower cost than the conventional semiconductor device assembled using the Au—Sn eutectic solder and the conventional semiconductor device assembled with the low temperature sintering method using the Ag nano-grains.

In addition, according to the fourth embodiment, the layer thickness of each fusing layer 41 is thinner than the layer thickness of the fusing layer 15 formed in the first embodiment. The two surfaces of the thin fusing layer 41 are sandwiched by the wiring layer 11b and the joint supporting layer 42. Consequently, it is possible to manufacture the semiconductor device in an even shorter time because the diffusion length of the fusing layer across the jointing support layer is broken into smaller lengths, so that a shorter heating time to enable formation of the alloy is possible.

Fifth Embodiment

The semiconductor device according to the fifth embodiment differs from the semiconductor device of the fourth embodiment in the structure of the jointing portion. The jointing portion of the semiconductor device will be explained with reference to FIG. 18. It should be understood that the joining layers 51 are shown in their alloyed state, such that the jointing layers 51a were originally comprised of joint supporting layers and fusing layers, and then heated to alloy the layers to form the alloyed jointing layers.

Figure 18:
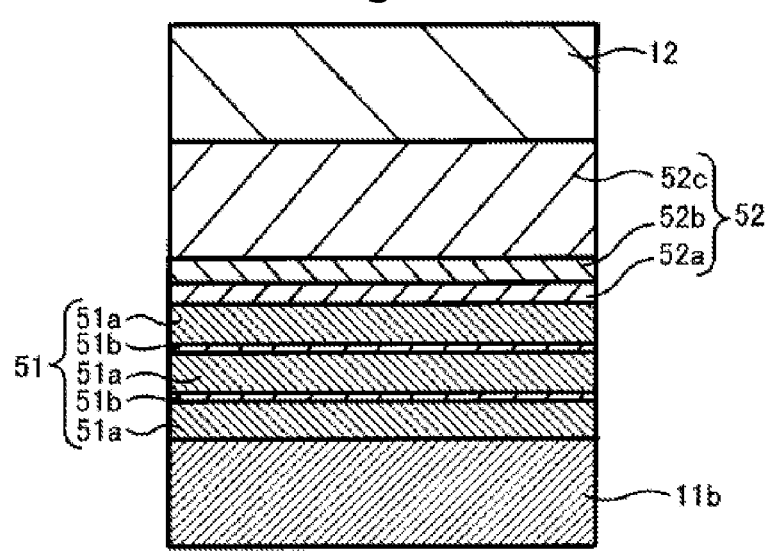
FIG. 18 is an enlarged cross-sectional view illustrating the joint portion of the semiconductor device according to a fifth embodiment.

FIG. 18 is an enlarged cross-sectional view illustrating the jointing portion of the semiconductor device according to the fifth embodiment. The semiconductor device according to this embodiment has the assembly substrate 11 and the semiconductor chip 12 identical to those in the semiconductor device according to the fourth embodiment. Here, the same keys as those in the above are adopted, and they will not be explained in detail again.

As shown in FIG. 18, in the jointing portion of the semiconductor device according to the fifth embodiment, the jointing layer 51 includes 3 alloyed jointing layers 51a and joint supporting layers 51b arranged between the alloyed jointing layers 51a.

Each of the alloyed jointing layers 51a has the same construction as that of the jointing layer 13, 13' of the semiconductor device 10 according to the first embodiment, and each of the joint supporting layers 51b is the same metal layer as the joint supporting layer 16 when the semiconductor device 10 according to the first embodiment is manufactured.

Here, between the jointing layer 51 and the semiconductor chip 12, the joint supporting layer 52a, the diffusion barrier layer 52b, and the soft metal layer 52c are formed in this order to form the stress relieving layer 52.

The semiconductor device according to this embodiment, the semiconductor chip 12 is assembled on the assembly substrate 11 as it is jointed with the wiring layer 11b of the assembly substrate 11 via the jointing layer 51 and the stress relieving layer 52. Here, the jointing layer 51 may have a thickness of about 10 μm or thinner.

In the step of operation shown in FIG. 14, this semiconductor device has each of the joint supporting layers is 42 formed to be thicker than those used in the Fourth Embodiment, or after the step of operation shown in FIG. 15, the time period for the diffusion between Sn and Cu is shortened so that each joint supporting layer 42 is left when the jointing layer 51 is formed. The residual joint supporting layer 42 becomes the joint supporting layers 51b, 52a of the semiconductor device according to this embodiment.

In the fifth embodiment, the semiconductor chip 12 is assembled on the assembly substrate 11 by plural alloyed jointing layers 51a with a melting point higher than 300° C., which is the upper limit of the workable temperature for the semiconductor device (the melting point of $Cu_6Sn_5$ is at about 450° C., and the melting point of $Cu_3Sn$ is at about 700° C.). Consequently, it is possible to provide a semiconductor device with a high heat resistance and a manufacturing method of the semiconductor device with a high heat resistance.

Also, because the stress relieving layer 52 containing the soft metal layer 52c and the diffusion barrier layer 52b is arranged on the jointing layer 51, it is possible to provide a semiconductor device with a high reliability and a manufacturing method of the semiconductor device with a high reliability.

Just as in the fourth and fifth embodiments, the fusing layers 41, the joint supporting layers 42 (51b, 52a), the diffusion barrier layer 52b, and the soft metal layer 52c may be made of metals other than the noble metals. Consequently, it is possible to manufacture the semiconductor device at a lower cost. In addition, the plural joint supporting layers 42 (51b, 52a) and the soft metal layer 52c may also be layers mainly made of Ag. Here, as the total layer thickness of the plural joint supporting layers 42 and the layer thickness of the soft metal layer 52c may be as thin as about 10 μm or thinner. Consequently, it is possible to manufacture the semiconductor device at a lower cost as compared with the conventional semiconductor device assembled using the Au—Sn eutectic solder and the conventional semiconductor device assembled with the low temperature sintering method using the Ag nano-grains.

In addition, according to the fifth embodiment, a joint supporting layer 51b is arranged between the alloy layers 51a, and the joint supporting layer 52a is arranged between the alloy layer 51a and the diffusion barrier layer 52b. For example, when Cu or other soft metal is adopted as the joint supporting layers 51b, 52a, just as the soft metal layer 52c, the joint supporting layers 51b, 52a also can help relieve the stress applied on the alloy layers 51a. Consequently, it is possible to provide a semiconductor device with a high reliability and a manufacturing method of the semiconductor device with a high reliability.

When the semiconductor device having the jointing portion as shown in FIG. 18 is manufactured, for the manufactured semiconductor device, due to thermal cycling or the like, mutual diffusion makes further progress between Sn and Cu, so that the joint supporting layers 51b, 52a are subsumed or alloyed into the jointing layers 51. Consequently, just as the stress relieving layer 14 of the semiconductor device according to the fourth embodiment, the stress relieving layer 52 finally becomes a structure containing the soft metal layer 52c and the diffusion barrier layer 52b. That is, it is possible to have the joint supporting layers 51b, 52a left at least in the semiconductor device right after manufacturing, so that it is possible to further improve the reliability of the semiconductor device right after manufacturing by providing additional thermal cycling induced stress relief with the remnant jointing layers 52 a, b until they become fully alloyed into the jointing layer 51.

Sixth Embodiment

Figure 19:
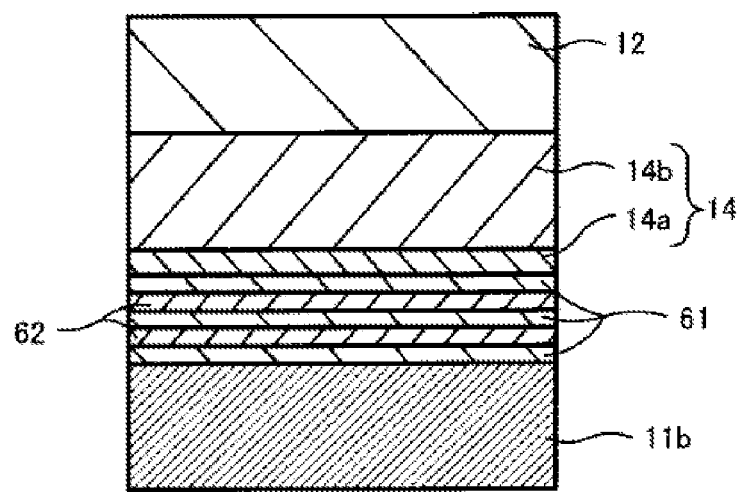
FIG. 19 is a cross-sectional view illustrating a step of operation in the manufacturing method of the semiconductor device according to a sixth embodiment.
Figure 20:
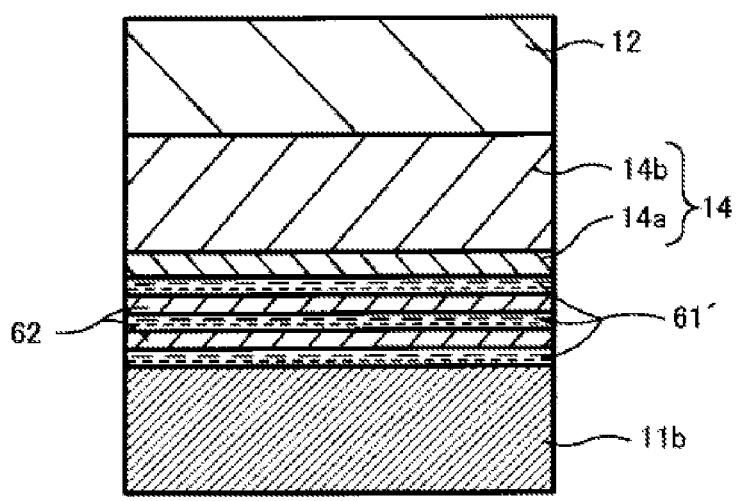
FIG. 20 is a cross-sectional view illustrating a step of operation in the manufacturing method of the semiconductor device according to the sixth embodiment.
Figure 21:
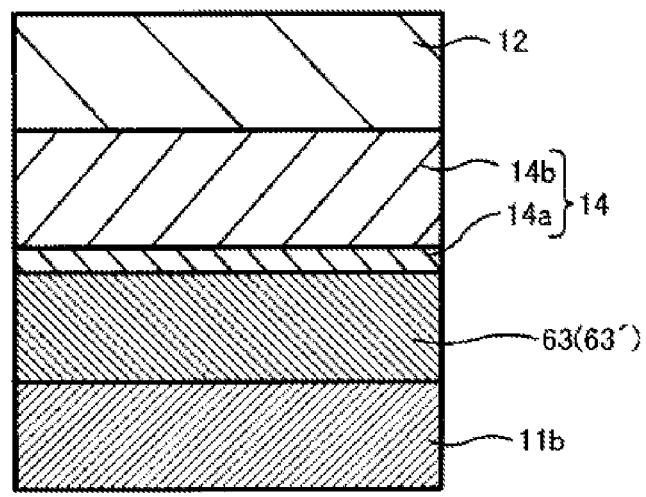
FIG. 21 is a cross-sectional view illustrating a step of operation in the manufacturing method of the semiconductor device according to the sixth embodiment.

The manufacturing method of the semiconductor device according to the sixth embodiment will be explained with reference to FIGS. 19, 20 and 21. Here, the FIGS. 19, 20 and 21 are cross-sectional views illustrating the steps of operation in manufacturing of the semiconductor device according to the sixth embodiment. Here, the assembly substrate 11, the semiconductor chip 12 and the stress relieving layer 14 are the same as those in the fourth embodiment, so that the same keys as those in the above are adopted, and they will not be explained in detail again.

According to this manufacturing method, as shown in FIG. 19, on the wiring layer 11b of the assembly substrate 11, the fusing layer 61 and the joint supporting layer 62 are formed or layered over the wiring layer 11b in this order 2 times, followed by the formation of a third fusing layer 61 on the second joint supporting layer 62, and then the diffusion barrier layer 14a and the soft metal layer 14b are formed thereover in this order. The fusing layers 61 are the same metal materials as the fusing layers 41 when the semiconductor device according to the fourth embodiment is manufactured. The joint supporting layers 62 are the same metal materials as the joint supporting layers 42 when the semiconductor device according to the fourth embodiment is manufactured.

According to the manufacturing method of the semiconductor device according to the fourth embodiment, as shown in FIG. 14, the joint supporting layer 42 is arranged between the uppermost fusing layer 41 and the diffusion barrier layer 14b. On the other hand, according to the present embodiment, this joint supporting layer is omitted and the diffusion barrier layer 14b is formed on the upper most fusing layer 41.

Then, as shown in FIG. 20, the various fusing layers 61 are converted to the liquid phase state, and, by the fusing layer 61' in the liquid phase state, the jointing surfaces of the assembly substrate 11 (wiring layer 11b), and the joint supporting layers 62 and the stress relieving layer 14 (diffusion barrier layer 14a) in contact with the fusing layer 61' are wetted by the liquid fusing layer 61'.

By keeping the fusing layers 61' in the liquid phase state for a prescribed time, diffusion takes place so that the ingredient (Cu) of the wiring layer 11b and the joint supporting layer 62 are interdiffused with the fusing layers 61' (Sn).

Due to the mutual diffusion, the fusing layer 61' in the liquid phase state is subsumed into the alloy, and, as shown in FIG. 21, between the assembly substrate 11 (wiring layer 11b) and the stress relieving layer 14, a jointing layer 63 mainly made of the alloy containing Sn, Cu that are isothermally solidified. The formed jointing layer 63 joins the semiconductor chip 12 and the wiring layer 11b of the assembly substrate 11.

Figure 22A:
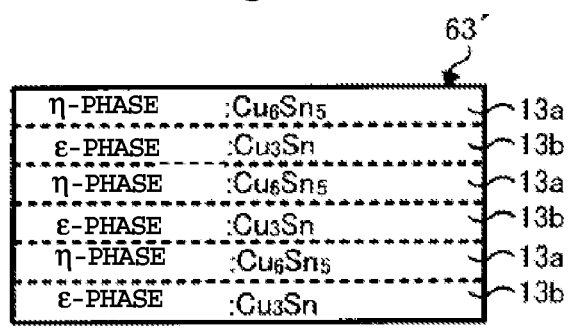
FIGS. 22A and 22B are diagrams illustrating in more detail the jointing layer of the semiconductor device according to the sixth embodiment.
Figure 22B:
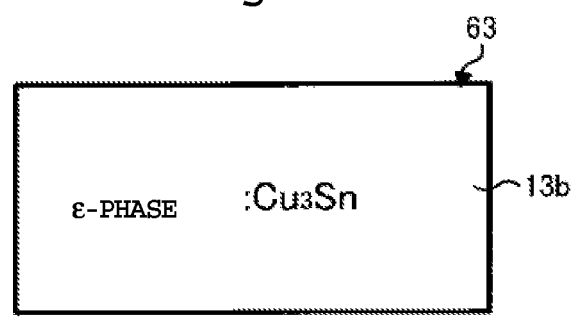

In the following, the structure of the jointing layer 63 of the semiconductor device manufactured using this method will be explained with reference to FIGS. 22A and 22B. Here, FIGS. 22A, 22B are diagrams for explaining the jointing layer 63 in more detail. Due to the mutual diffusion between the Cu ingredient of the wiring layer 11b and the joint supporting layer 62 and the Sn ingredient of the fusing layers 61' melted to the liquid phase state, as shown in FIG. 22A, with the region where the fusing layer 61' exists at the center, the η-phase inter-metallic compound 13a (Cu$_6$Sn$_5$) is formed, and, with the region where the wiring layer 11b and the joint supporting layer 62 exist at the center, the ε-phase inter-metallic compound 13b (Cu$_3$Sn) is formed. As a result, the ε-phase inter-metallic compound 13b and the η-phase inter-metallic compound 13a are layered in this order repeatedly in 3 rounds to form the jointing layer 63'.

However, after formation of the jointing layer 63' shown in FIG. 22A, in the process of manufacturing of the semiconductor device, the mutual diffusion between Cu and Sn progresses. In addition, after manufacturing of the semiconductor device having the jointing layer 63' shown in FIG. 22A, due to the thermal cycling during operation and use of the semiconductor device, the mutual diffusion between Cu and Sn further progresses. Finally, as shown in FIG. 22B, the jointing layer 63 completely made of the ε-phase inter-metallic compound 13b results. The structure of the jointing layer 63 is the same as that of the jointing layer 43 shown in FIG. 17B and that of the jointing layer 13 shown in FIG. 8B.

That is, for the semiconductor device right after manufacturing using the manufacturing method of the semiconductor device according to the sixth embodiment, the semiconductor chip 12 is assembled on the assembly substrate 11 by either the jointing layer 63' shown in FIG. 22A or the jointing layer 63 shown in FIG. 22B. Even when the semiconductor chip 12 is assembled on the assembly substrate 11 by the jointing layer 63' shown in FIG. 22A, due to the thermal cycling or the like related to the operation and use of the semiconductor device thereafter the jointing layer 63 shown in FIG. 22B will form.

In this way, the semiconductor device according to the sixth embodiment differs from the semiconductor device according to the fourth embodiment in that it has a different structure of the jointing layer 63'.

In addition, the formed jointing layers 63 and 63' may have a thickness of about 10 μm or thinner.

According to the sixth embodiment, the semiconductor chip 12 is jointed with the wiring layer 11b of the assembly substrate 11 by either the jointing layer 63' with a melting point at about 450° C., the melting point of Cu$_6$Sn$_5$, or the jointing layer 63 with a melting point at about 700° C., the melting point of Cu$_3$Sn. The melting points of the jointing layers 63, 63' are higher than 300° C., the upper limit of the workable temperature for the semiconductor device, so that it is possible to provide a semiconductor device with a high heat resistance and a manufacturing method of the semiconductor device with a high heat resistance.

In addition, as the stress relieving layer 14 containing the soft metal layer 14b and the diffusion barrier layer 14a is arranged on the jointing layer 63 or 63', it is possible to provide a semiconductor device with a high reliability and a manufacturing method of the semiconductor device with a high reliability.

Just as in the fourth embodiment, according to the sixth embodiment, the fusing layers 61, the joint supporting layers 62, the diffusion barrier layer 14a and the soft metal layer 14b can be made of metals other than the noble metals, so that it is possible to manufacture the semiconductor device at a lower cost. The plural joint supporting layers 62 and the soft metal layer 14b may also be layers mainly made of Ag. Here, as the total layer thickness of the plural joint supporting layers 62 and the layer thickness of the soft metal layer 14b may be as thin as about 10 μm or thinner, so that it is possible to manufacture the semiconductor device at a lower cost than the conventional semiconductor device assembled using the Au—Sn eutectic solder and the conventional semiconductor device assembled with the low temperature sintering method using the Ag nano-grains.

In addition, according to the sixth embodiment, different from the manufacturing method of the semiconductor device according to the fourth embodiment, the number of the joint supporting layers is decreased by 1, and the jointing layers 63 and 63' are formed, which is different from the manufacturing method of the semiconductor device according to in fourth embodiment, it is possible to have less steps of operation of manufacturing, so that the semiconductor device can be manufactured more easily.

In the above, explanation has been made on the semiconductor devices and manufacturing methods of the semiconductor devices according to the various embodiments of the present invention. The upper limit of the workable temperature of the semiconductor device is at 300° C., and the jointing layers 13, 13', 21, 32, 32', 43, 43', 51, 63, 63' are formed from alloys with higher melting points. The joint supporting layers 16, 22a, 42, 51b, 52a and 62 are made of Cu, and the fusing layers 15, 31, 41 and 61 are made of Sn. Consequently, for the semiconductor devices with the upper limit of the workable temperature higher than 300° C., the materials for the joint supporting layers 16, 22a, 42, 51b, 52a, 62 and the materials for the fusing layers 15, 31, 41, 61 are selected to ensure that the jointing layers 13, 13', 21, 32, 32', 43, 43', 51, 63, 63' are made of alloys with higher melting points. Also, the materials of the soft metal layers 14b, 22c, 52c and the materials of the diffusion barrier layers 14a, 22b, 52b should be selected corresponding to the materials selected for the joint supporting layers 16, 22a, 42, 51b, 52a, 62 and the materials for the fusing layers 15, 31, 41, 61.

The assembly substrate 11 having the semiconductor chip 12 assembled on it by the jointing layer 13, 13', 21, 32, 32', 43, 43', 51, 63, or 63' and the stress relieving layer 14, 22, or 52 are not limited to the assembly substrate having the wiring layer 11b arranged on the outer surface and back surface of the insulating substrate 11a mainly made of SiN. For example, the assembly substrate may be an assembly substrate having the wiring layers formed on the outer surface and back surface of the insulating substrate mainly made of aluminum nitride (AlN).

Figure 23:
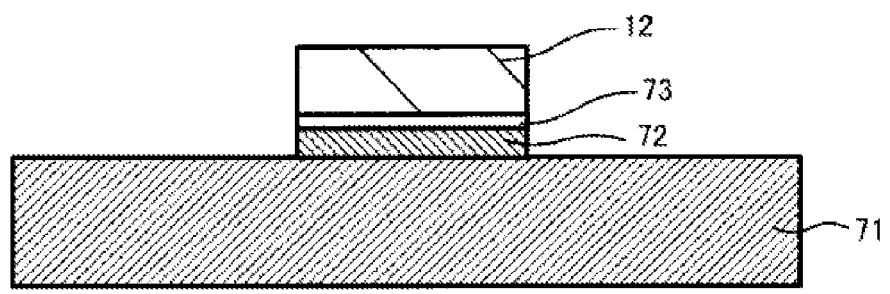
FIG. 23 is a cross-sectional view illustrating a modified example of the assembling substrate.

Also, in addition to the assembly substrate having the wiring layers 11b and 11c formed on the two surfaces of the insulating substrate 11a, respectively, the assembly substrate may also an electroconductive substrate widely adopted for, e.g., the discrete type semiconductor devices. For example, as shown in FIG. 23, the assembly substrate may be either a copper substrate 71, or a substrate prepared by jointing the semiconductor chip 12 on the surface of the copper substrate 71 by a jointing layer 72 and a stress relieving layer 73. Also, the jointing layer 72 may be any of the jointing layers, 13, 13', 21, 32, 32', 43, 43', 51, 63, and 63' explained in the aforementioned embodiments, and the stress relieving layer 73 may be any of the stress relieving layers 14, 22 and 52 explained in the aforementioned embodiments.

The types of the copper substrate 71 include not only the pure-copper substrate, but also the copper alloy substrate, as well as the copper-bonded substrates prepared by bonding copper sheet or copper alloy sheet on the surface of insulating substrates made of, e.g., alumina, AlN, SiN, glass, etc.

Figure 24:
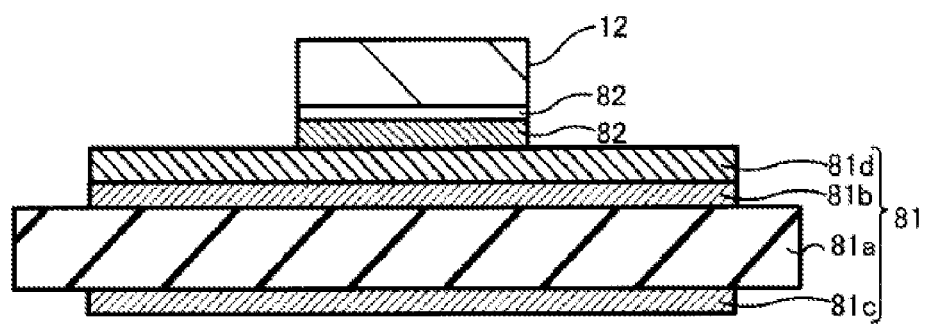
FIG. 24 is a cross-sectional view illustrating a modified example of the assembling substrate.

In addition, as shown in FIG. 24, the assembly substrate may be the assembly substrate 81 prepared by arranging a wiring layer 81b on the outer surface of an insulating substrate 81a and a wiring layer 81c on the back surface, followed by arranging a plating layer 81d mainly made of Ag or Au on the wiring layer 81b. Also, the semiconductor chip 12 may be joined by the jointing layer 82 and a stress relieving layer 83 on the surface of the plating layer 81d of the assembly substrate 81. Except the plating layer 81d, the various features of the constitution of the assembly substrate 81 are the same as those of the assembly substrate 11 shown in FIG. 1. The jointing layer 82 may be any of the jointing layers, 13, 13', 21, 32, 32', 43, 43', 51, 63, and 63' explained in the aforementioned embodiments, and the stress relieving layer 83 may be any of the stress relieving layers 14, 22, and 52 explained in the aforementioned embodiments.

Figure 25:
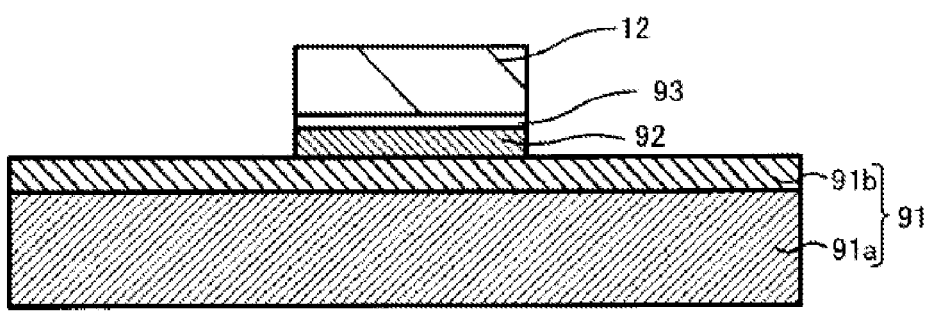
FIG. 25 is a cross-sectional view illustrating a modified example of the assembling substrate.

Similarly, as shown in FIG. 25, the assembly substrate may be the assembly substrate 91 prepared by arranging a plating layer 91b mainly made of Ag or Au on the surface of the copper substrate 91a, or it may have the semiconductor chip 12 jointed by the jointing layer 92 and the stress relieving layer 93 on the surface of the plating layer 91b of the assembly substrate 91. Also, just as the copper substrate 71 shown in FIG. 23, for the copper substrate 91a, the jointing layer 92 may be any of the jointing layers 13, 13', 21, 32, 32', 43, 43', 51, 63, 63' explained in the aforementioned embodiments, and the stress relieving layer 93 may be any of the stress relieving layers 14, 22, 52 explained in the various embodiments.

As shown in FIGS. 24 and 25, by arranging the plating layer 81d or 91b on the surface of the assembly substrate 81 or 91, it is possible to suppress formation of the oxide film as the diffusion barrier, and it is possible to suppress formation of voids after jointing. Consequently, it is possible to improve the joint reliability.

Here, the semiconductor chip 12 is not limited to the high output semiconductor chip mainly made of SiC. The semiconductor chip 12 may also be mainly made of, e.g., silicon (Si), or the high output semiconductor chip mainly made of gallium arsenide (GaAs), gallium nitride (GaN), etc. In addition, there is no specific restriction on the type of the semiconductor chip, and it may also be the discrete type and modular type, etc.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
   an assembly substrate;
   a semiconductor chip joined to the assembly substrate through a jointing layer that is between the assembly substrate and the semiconductor chip the jointing layer including an alloy comprising:
   at least one of Sn, Zn and In, and at least one of Cu, Ni, Ag, Cr, Zr, Ti and V; and
   a soft metal layer between the jointing layer and the semiconductor chip and including any metal selected from Cu, Al, Zn and Ag, wherein
   the jointing layer includes at least two phases of the alloy.

2. The semiconductor device of claim 1, wherein a first phase of the alloy has a higher melting point than a second phase of the alloy.

3. The semiconductor device of claim 2, wherein the second phase converts to the first phase during thermal cycling occurring during use of the semiconductor device.

4. The semiconductor device of claim 1, further including a conductive metal region on the substrate, and, an alloy is formed between a portion of the conductive metal on the substrate and at least one of Sn, Zn and In.

5. A semiconductor device, comprising:
an assembly substrate;
a semiconductor chip joined to the assembly substrate through a jointing layer that is between the assembly substrate and the semiconductor chip and is an alloy comprising:
at least one of Sn, Zn and In, and
at least one of Cu, Ni, Ag, Cr, Zr, Ti and V; and
a soft metal layer between the jointing layer and the semiconductor chip and including any metal selected from Cu, Al, Zn and Ag; and
at least one layer of at least one of Cu, Ni, Ag, Cr, Zr, Ti and V which is not alloyed with Sn, In or Zn.

6. The semiconductor device of claim 1, wherein the jointing layer includes at least two sub-layers and at least one of the sub-layers includes the at least two different phases of the alloy.

7. The semiconductor device of claim 6, further comprising:
a layer of non-alloyed Cu, Ni, Ag, Cr, Zr, Ti or V.

8. The semiconductor device of claim 1, further including a diffusion barrier layer arranged between the jointing layer and the soft metal layer and including any metal selected from Ni, Cr, Mo, Ta, V and W.

9. The semiconductor device of claim 1, wherein the alloy is a copper-tin alloy.

10. The semiconductor device of claim 9, wherein the soft metal layer has a thickness between 1 micron and 10 microns.

11. The semiconductor device of claim 1, wherein the soft metal layer has a thickness between 1 micron and 10 microns.

12. The semiconductor device of claim 5, wherein the alloy is a copper-tin alloy.

13. The semiconductor device of claim 12, wherein the soft metal layer has a thickness between 1 micron and 10 microns.

14. The semiconductor device of claim 5, wherein the soft metal layer has a thickness between 1 micron and 10 microns.

* * * * *